US010338101B2

(12) United States Patent
Tamura

(10) Patent No.: US 10,338,101 B2
(45) Date of Patent: Jul. 2, 2019

(54) PROBER

(71) Applicant: Tokyo Seimitsu Co., Ltd., Tokyo (JP)

(72) Inventor: Hiroo Tamura, Tokyo (JP)

(73) Assignee: Tokyo Seimitsu Co., Ltd., Tokyo (JP)

( * ) Notice: Subject to any disclaimer, the term of this patent is extended or adjusted under 35 U.S.C. 154(b) by 0 days.

(21) Appl. No.: 15/717,819

(22) Filed: Sep. 27, 2017

(65) Prior Publication Data
US 2018/0017594 A1    Jan. 18, 2018

Related U.S. Application Data

(63) Continuation of application No. PCT/JP2016/060521, filed on Mar. 30, 2016.

(30) Foreign Application Priority Data

Mar. 30, 2015 (JP) ................. 2015-069272
Mar. 29, 2016 (JP) ................. 2016-066460

(51) Int. Cl.
*G01R 31/00* (2006.01)
*G01R 1/073* (2006.01)
(Continued)

(52) U.S. Cl.
CPC ..... *G01R 1/07314* (2013.01); *G01R 1/06722* (2013.01); *G01R 1/07342* (2013.01); *G01R 31/2887* (2013.01); *G01R 31/26* (2013.01)

(58) Field of Classification Search
CPC ............ G01R 1/07314; G01R 1/07342; G01R 1/07378; G01R 1/06711; G01R 1/06722;
(Continued)

(56) References Cited

U.S. PATENT DOCUMENTS 5,325,052 A * 6/1994 Yamashita ......... G01R 1/06738
324/750.08
5,675,261 A * 10/1997 Lee .................... G01R 1/06705
324/754.07
(Continued)

FOREIGN PATENT DOCUMENTS

JP    2009-060037 A    3/2009
JP    2010-034482 A    2/2010
(Continued)

OTHER PUBLICATIONS

Tokyo Seimitsu Co., Ltd., International Preliminary Report on Patentability, PCT/JP2016/060521, dated Feb. 7, 2017, 10 pgs.
(Continued)

*Primary Examiner* — Thang X Le
(74) *Attorney, Agent, or Firm* — Morgan, Lewis & Bockius LLP

(57) ABSTRACT

Provided is a prober capable of maintaining parallelism between a probe card and a wafer as well as performing wafer-level inspection with high accuracy. A test head is held by a test head holding part, and the test head and a probe card are sucked and fixed to a pogo frame attached to a head stage. A wafer chuck is moved toward a probe card while being fixed to a Z-axis movement-rotation unit in a detachable manner, and the wafer chuck is drawn toward the probe card by reducing pressure in an air-tight space formed between the wafer chuck and the probe card using a pressure reducing unit. Then, an electrical inspection of a wafer is performed while the test head, the pogo frame, the probe card, and the wafer chuck are integrated with respect to the head stage.

9 Claims, 7 Drawing Sheets

(51) Int. Cl.
*G01R 1/067* (2006.01)
*G01R 31/28* (2006.01)
*G01R 31/26* (2014.01)

(58) Field of Classification Search
CPC ............ G01R 1/06738; G01R 1/06772; G01R 31/2886; G01R 31/2889
USPC .......... 324/756.03, 754.01, 754.03, 324/754.07–754.11, 754.13, 754.14, 324/757.03, 755.01, 755.11, 756.01
See application file for complete search history.

(56) References Cited

U.S. PATENT DOCUMENTS

| | | | |
|---|---|---|---|
| 9,562,942 B2* | 2/2017 | Shinohara | G01R 1/0491 |
| 2005/0151549 A1* | 7/2005 | Okumura | G01R 31/2898 |
| | | | 324/750.03 |
| 2008/0297184 A1* | 12/2008 | Miura | G01R 1/07364 |
| | | | 324/762.05 |
| 2010/0079161 A1* | 4/2010 | Endo | G01R 31/2887 |
| | | | 324/754.12 |
| 2011/0095779 A1 | 4/2011 | Washio et al. | |
| 2013/0200914 A1* | 8/2013 | Kim | G01R 1/07342 |
| | | | 324/756.03 |
| 2015/0130489 A1* | 5/2015 | Yamada | G01R 31/2891 |
| | | | 324/754.11 |
| 2015/0145540 A1* | 5/2015 | Komatsu | G01R 31/2874 |
| | | | 324/750.03 |
| 2015/0219710 A1* | 8/2015 | Lee | G01R 31/2601 |
| | | | 324/756.03 |
| 2015/0260788 A1 | 9/2015 | Yamada | |

FOREIGN PATENT DOCUMENTS

| | | |
|---|---|---|
| JP | 2011-089891 A | 5/2011 |
| JP | 2014-075420 A | 4/2014 |
| JP | 2014-150168 A | 8/2014 |

OTHER PUBLICATIONS

Tokyo Seimitsu Co., Ltd., Notification of Reasons for Rejection, JP2016-066460, dated Apr. 26, 2016, 8 pgs.
Tokyo Seimitsu Co., Ltd., Decision of Rejection, JP2016-066460, dated Jun. 8, 2016, 5 pgs.

\* cited by examiner

PROBER

CROSS-REFERENCE TO RELATED APPLICATIONS

This application is a Continuation of PCT International Application No. PCT/JP2016/060521 filed on Mar. 30, 2016, which claims priorities under 35 U.S.C. § 119(a) to Japanese Patent Application No. 2015-069272 filed on Mar. 30, 2015 and Japanese Patent Application No. 2016-066460 filed on Mar. 29, 2016. Each of the above applications is hereby expressly incorporated by reference, in their entirety, into the present application.

BACKGROUND OF THE INVENTION

1. Field of the Invention

The present invention relates to a prober that inspects electrical characteristics of a plurality of semiconductor devices (chips) formed on a semiconductor wafer, and more particularly to a prober including a plurality of measuring sections which are stacked to form a multistage structure.

2. Description of the Related Art

A semiconductor manufacturing process includes a large number of steps, and various inspections are performed in various manufacturing steps to improve quality assurance and yields. For example, in a phase where a plurality of chips or semiconductor devices are formed on a semiconductor wafer, wafer-level inspection is performed as follows: an electrode pad of each of the chips or semiconductor devices is connected to a test head so that the test head supplies power and a test signal to the semiconductor device; and the test head measures a signal output from each of the semiconductor devices to electrically inspect whether each of the semiconductor devices operates correctly.

After the wafer-level inspection, the wafer is attached to a frame and is cut into individual chips by a dicer. Among the cut chips, only chips judged to work correctly are packaged in a subsequent assembling step, and malfunctioning chips are eliminated from the assembling step. In addition, shipping inspection is performed for packaged final products.

The wafer-level inspection is performed by using a prober that brings a probe into contact with the electrode pad of each of the chips on the wafer (e.g., refer to Japanese Patent Application Laid-Open No. 2009-060037, hereinafter referred to as PTL 1). The probe is electrically connected to a terminal of the test head, so that power and a test signal are supplied to each of the chips from the test head through the probe. Then, the test head detects an output signal from each of the chips to determine whether the chip operates correctly.

In a semiconductor manufacturing process, a wafer are increasing in size and precision (integration) to reduce manufacturing cost, and the number of chips formed on one wafer is greatly increased. Accordingly, time required for inspection on one wafer by the prober increases, so that increase in throughput is required. To increase throughput, a large number of probes are provided in a prober so as to perform multiple probing in which a plurality of chips can be simultaneously inspected. In recent years, the number of chips to be simultaneously inspected has been further increasing, and simultaneous inspection on every chip on a wafer also has been attempted. Thus, a tolerance of positioning (alignment) when an electrode pad and a probe are brought into contact with each other is reduced, so that a prober is required to increase position accuracy when moving.

Meanwhile, as a simplest method for increasing throughput, increase in the number of probers can be considered; however, the increase in the number of probers causes a problem of increasing an installation area for the probers in a manufacturing line. In addition, the increase in the number of probers increases device cost accordingly. Thus, it is required to increase in throughput while suppressing increase in the installation area and device cost.

To cope with the problem as described above, Japanese Patent Application Laid-Open No. 2014-150168 (hereinafter, referred to as PTL 2) provides a prober including a plurality of measuring sections which are stacked to form a multistage structure. Because the prober has a layered structure (multistage structure) in which a plurality of measuring sections are stacked in multiple stages, wafer-level inspection can be performed for each measuring section and throughput can be increased while suppressing increase in an installation area and device cost.

CITATION LIST

Patent Literature

PTL 1: Japanese Patent Application Laid-Open No. 2009-060037
PTL 2: Japanese Patent Application Laid-Open No. 2014-150168

SUMMARY OF THE INVENTION

In a prober disclosed in PTL 1, a test head is held by a holder and is rotated from a retreat position away from a top board (head stage) of the prober body to a position of a horizontal posture. Then, the test head is delivered to a lifting support assembly provided in a prober body and the lifting support assembly lowers the test head to attach the test head to the prober body.

A probe card is attached to the head stage, and parallelism between the probe card and a wafer needs to be secured to accurately perform inspection by bringing each probe of the probe card into contact with an electrode pad of the corresponding one of the chips on the wafer. In particular, in the case of so-called a batch contact method in which every chip on a wafer is simultaneously inspected, more accurate parallelism between a probe card and a wafer is required to bring each probe of the probe card into uniform contact with an electrode pad of each chips on the wafer.

However, because the prober disclosed in PTL 2 includes a plurality of measuring sections that is stacked in multiple stages, it is difficult to adopt the structure as disclosed in PTL 1 due to layout constraints.

For example, there may be a case where a test head is directly mounted on a head stage. However, in this case, when a load of the test head applied to the head stage exceeds an allowable range, deformation of the head stage increases and parallelism between a probe card and a wafer cannot be maintained. This may cause deterioration of measurement accuracy in wafer-level inspection.

In addition, while the prober disclosed in PTL 2 is configured to allow a wafer chuck to be drawn toward the probe card by reducing pressure in an internal space formed between the probe card and the wafer chuck, the wafer chuck may be inclined or displaced by influence of an unbalanced load and the like caused by a component of the wafer chuck. In this case, parallelism between the probe card and the wafer deteriorates and each probe of the probe card cannot be brought into uniform contact with an electrode pad of each of the chips on the wafer, thereby resulting in deterioration in measurement accuracy of wafer-level inspection.

The present invention is made in light of the above-mentioned circumstances, and aims to provide a prober capable of maintaining parallelism between a probe card and a wafer, and performing wafer-level inspection with high accuracy.

To achieve the object described above, a prober according to an aspect of the present invention includes a plurality of measuring sections stacked to form a multistage structure, wherein each of the measuring sections includes: a test head; a probe card having probes; a pogo frame provided between the test head and the probe card; a head stage having a pogo frame attachment portion to which the pogo frame is attached; a frame member that supports the head stage; a test head holding part supported by the frame member and configured to hold the test head; a wafer chuck configured to hold a wafer; a first suction fixing part that fixes the test head and the pogo frame to each other by suction; a second suction fixing part that fixes the probe card and the pogo frame to each other by suction; a mechanical lifting unit having a wafer chuck fixing part that fixes the wafer chuck in a detachable manner, the mechanical lifting unit configured to move the wafer chuck fixed to the wafer chuck fixing part, up and down; a seal member in an annular shape, configured to form an air-tight space between the wafer chuck and the probe card; and a pressure reducing unit configured to reduce pressure in the air-tight space to allow the wafer chuck to be drawn toward the probe card, wherein an electrical inspection of the wafer is performed in a state where the test head, the pogo frame, the probe card and the wafer chuck are integrated with respect to the head stage.

According to the above aspect, a load of the test head is not directly applied to the head stage and deformation of the pogo frame is prevented. As a result, parallelism between the wafer and the probe card can be easily secured and in accuracy of wafer-level inspection can be improved.

In the aspect of the prober according to the present invention, the test head holding part includes: a lifting mechanism configured to move the test head up and down; a guide part having a restriction face configured to guide the test head when the test head is moved up and down; and a buffer that has a spring member configured to urge the test head toward an opposite side of the pogo frame.

According to the above aspect, the test head holding part includes the lifting mechanism, the guide part and the buffer, and the test head holding part is configured to allow the test head to be supported by the frame member. As a result, when the lifting mechanism moves the test head up and down between a mounting position and a retreat position, the up-and-down movement of the test head is guided by the guide part in a state where a position and direction of the test head are restricted by the guide part, and the buffer properly maintains distance and parallelism between the test head and the pogo frame. Thus, a load of the test head is not directly applied to the head stage, and deformation of the pogo frame is prevented to enable parallelism between the wafer and the probe card to be easily secured, thereby enabling improvement in accuracy of wafer-level inspection.

In the aspect of the prober according to the present invention, it is preferable that a plurality of buffers are provided at positions away from a barycenter of the test head at an equal distance. According to the aspect, because the load of the test head is equally distributed, a horizontal posture of the test head can be properly maintained, thereby further increasing advantageous effects of the present invention.

In the aspect of the prober according to the present invention, it is preferable that the pogo frame attachment portion has a suction face to which the pogo frame is sucked and fixed. According to the aspect, the pogo frame is reliably fixed to the head stage. Here, it is preferable that the pogo frame attachment portion includes positioning means (positioning unit) such as a positioning pin configured to perform positioning of the pogo frame with respect to the head stage.

In the aspect of the prober according to the present invention, it is preferable that the test head and the pogo frame are fixed to each other by suction, and that the probe card and the pogo frame are fixed to each other by suction. According to the aspect, it is possible to secure contact pressure required to achieve electrical continuity between the test head and the pogo frame, and that between the probe card and the pogo frame, so that influence of variation of terminals connecting between them can be reduced.

In the aspect of the prober according to the present invention, it is preferable that an electrical inspection of a wafer is performed in a state where the wafer chuck and the probe card are integrated with each other by suction. According to the aspect, a probe can be brought into contact with an electrode pad of each chip of a wafer with a proper contact pressure, so that accuracy of wafer-level inspection can be improved.

To achieve the object described above, another aspect of a prober according to the present invention includes: a wafer chuck configured to hold a wafer; a probe card provided so as to face the wafer chuck, and having probes at positions corresponding to respective electrode pads of the wafer; a test head held on an opposite side to the wafer chuck with respect to the probe card by a test head holding part; a pogo frame provided between the probe card and the test head, and configured to electrically connect the test head and the probe card; a head stage having a pogo frame attachment portion to which the pogo frame is attached; a seal member in an annular shape, the seal member provided on the wafer chuck so as to surround the wafer held by the wafer chuck; a mechanical lifting unit having a wafer chuck fixing part that fixes the wafer chuck in a detachable manner, the mechanical lifting unit configured to move the wafer chuck fixed to the wafer chuck fixing part, up and down; a pressure reducing unit configured to reduce pressure in an internal space defined by the probe card, the wafer chuck and the seal member; and a guide unit configured to guide movement of the wafer chuck while restricting movement in a direction orthogonal to a movement direction of the wafer chuck, when the wafer chuck is moved toward the probe card by reducing pressure in the internal space using the pressure reducing unit.

According to the above aspect, the guide unit guides movement of the wafer chuck while restricting movement in the direction orthogonal to the movement direction of the wafer chuck when the wafer chuck is drawn toward the probe card using pressure reduction in the internal space by the pressure reducing unit. Therefore, the wafer chuck can be prevented from being inclined or displaced. Thus, parallelism between the wafer and the probe card can be easily secured to enable accuracy of wafer-level inspection to be improved.

In the other aspect of the prober according to the present invention, it is preferable that the guide unit includes a bearing provided in the wafer chuck, and a guide shaft that is fixed to the head stage in a detachable manner and is axially supported by the bearing. This aspect shows one of specific structure of the guide unit.

In the other aspect of the prober according to the present invention, it is preferable that at least three guide units are provided at different positions in the direction orthogonal to the movement direction of the wafer chuck. According to this aspect, the wafer chuck can be reliably prevented from being inclined in the direction orthogonal to the movement direction of the wafer chuck.

In the other aspect of the prober according to the present invention, it is preferable to provide a height detection sensor configured to detect a relative distance between the wafer chuck and the wafer chuck when the pressure reducing unit reduces pressure in the internal space. According to this aspect, the wafer chuck can be positioned at a proper height when the wafer chuck is drawn toward the probe card by reducing pressure in the internal space using the pressure reducing unit.

In the other aspect of the prober according to the present invention, it is preferable that at least three height detection sensors are provided at different positions in the direction orthogonal to the movement direction of the wafer chuck. According to this aspect, when the wafer chuck is drawn toward the probe card by reducing pressure in the internal space using the pressure reducing unit, it is possible to check a crushing amount (overdrive amount) of the probe, to monitor the inclination of the wafer chuck, state change during measurement, and the like, and to accurately determine whether measurement is correctly performed.

In the other aspect of the prober according to the present invention, it is preferable that the test head holding part includes: a lifting mechanism configured to move the test head up and down; a guide part having a restriction face configured to guide the test head when the test head is moved up and down; and a buffer that has a spring member configured to urge the test head toward an opposite side of the pogo frame. According to this aspect, when the lifting mechanism moves the test head up and down between a mounting position and a retreat position, the up-and-down movement of the test head is guided by the guide part in a state where the position and direction of the test head is restricted, and the buffer properly maintains distance and parallelism between the test head and the pogo frame. Thus, parallelism between the wafer and the probe card can be easily secured, and accuracy of wafer-level inspection can be improved.

In the other aspect of the prober according to the present invention, it is preferable that a plurality of buffers are provided at positions away from the barycenter of the test head at an equal distance. According to this aspect, because a load of the test head is equally distributed, a horizontal posture of the test head can be properly maintained, thereby further increasing advantageous effects of the present invention.

In the other aspect of the prober according to the present invention, it is preferable that the pogo frame attachment portion has a suction face to which the pogo frame is sucked and fixed. According to this aspect, the pogo frame is reliably fixed to the head stage. It is preferable that the pogo frame attachment portion includes positioning means (positioning unit) such as a positioning pin configured to perform positioning of the pogo frame with respect to the head stage.

According to the present invention, parallelism between a probe card and a wafer can be maintained, and wafer-level inspection can be performed with high accuracy.

DESCRIPTION OF EMBODIMENTS

Hereinafter, a preferable embodiment of the present invention will be described with reference to accompanying drawings.

Figure 1:
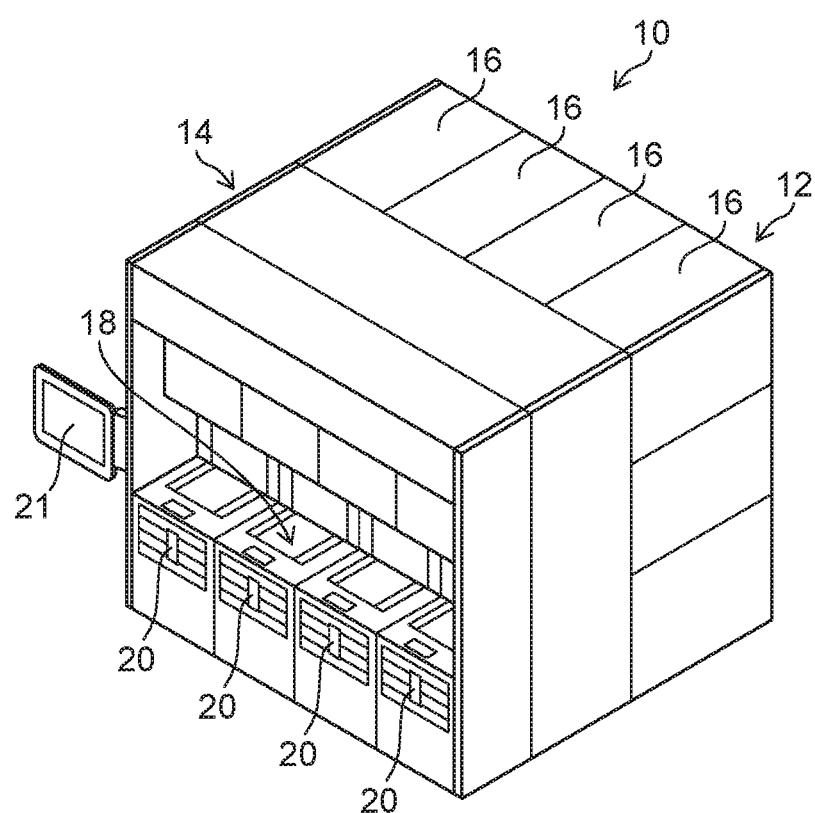
FIG. 1 is an external view illustrating a general structure of a prober according to an embodiment of the present invention.
Figure 2:
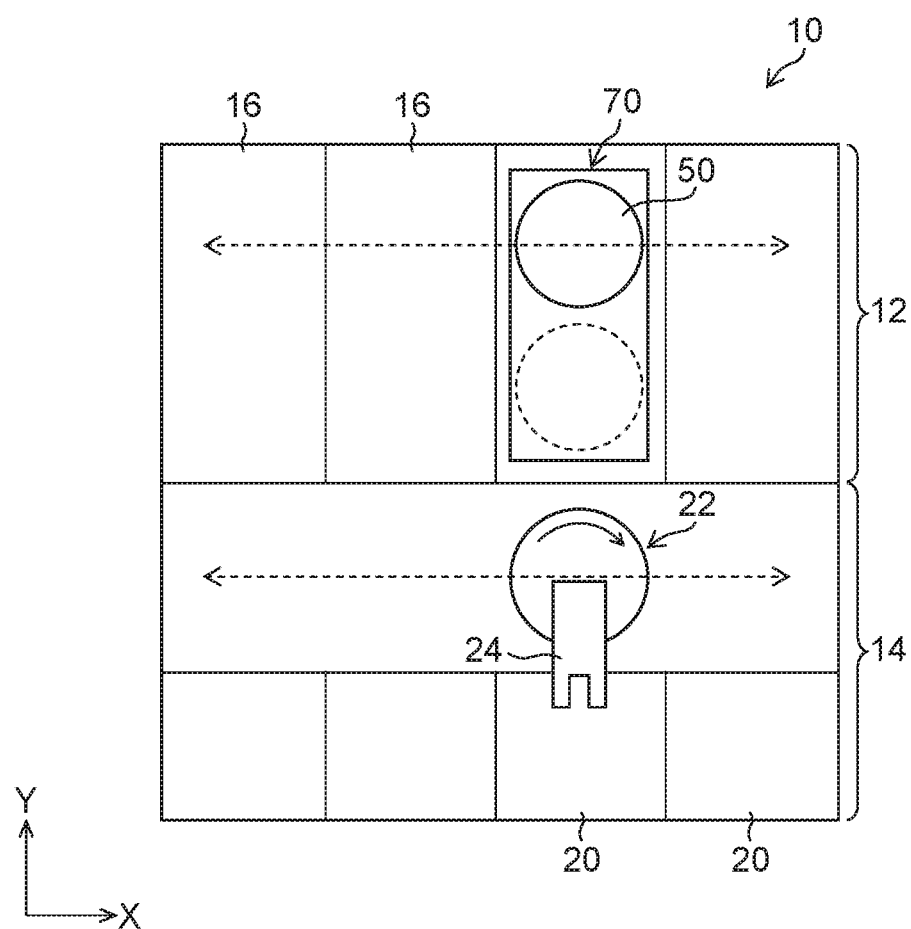
FIG. 2 is a plan view of the prober illustrated in FIG. 1.

FIGS. 1 and 2 are respectively an external view and a plan view, each of which illustrating a general structure of a prober according to an embodiment of the present invention.

As illustrated in FIGS. 1 and 2, a prober 10 according to the present embodiment includes a loader unit 14 that supplies and recovers a wafer W (refer to FIG. 4) to be inspected, and a measuring unit 12 disposed adjacent to the loader unit 14. The measuring unit 12 includes a plurality of measuring sections 16. When a wafer W is supplied to each of the measuring sections 16 from the loader unit 14, each of the measuring sections 16 performs inspection (wafer-level inspection) of electrical characteristics of each chip of the wafer W. Then the wafer W inspected in one of the measuring sections 16 is recovered by the loader unit 14. The prober 10 also includes an operation panel 21, a control device (not illustrated) that controls each unit, and the like.

The loader unit 14 includes load ports 18 in each of which a wafer cassette 20 is placed, and a transportation unit 22 that transports a wafer W between each of the measuring sections 16 of the measuring unit 12 and the corresponding wafer cassette 20. The transportation unit 22 includes a transportation unit driving mechanism (not illustrated). The transportation unit 22 is configured to be movable in X and Z directions, and rotatable in a θ direction (around a Z direction). The transportation unit 22 also includes a transportation arm 24 configured to be able to extend and contract (expandable) back and forth by using the transportation unit driving mechanism. A suction pad (not illustrated) is provided on the top surface of the transportation arm 24, and the transportation arm 24 holds the wafer W by applying vacuum suction to a back face of the wafer W through the suction pad. With the configuration, the wafer W in the wafer cassette 20 is taken out by the transportation arm 24 of the transportation unit 22 and is transported to the corresponding one of the measuring sections 16 of the measuring unit 12 while being held on the top surface of the transportation arm 24. In addition, the wafer W whose inspection has been finished is returned to the wafer cassette 20 from the corresponding one of the measuring sections 16 through an inverse route.

Figure 3:
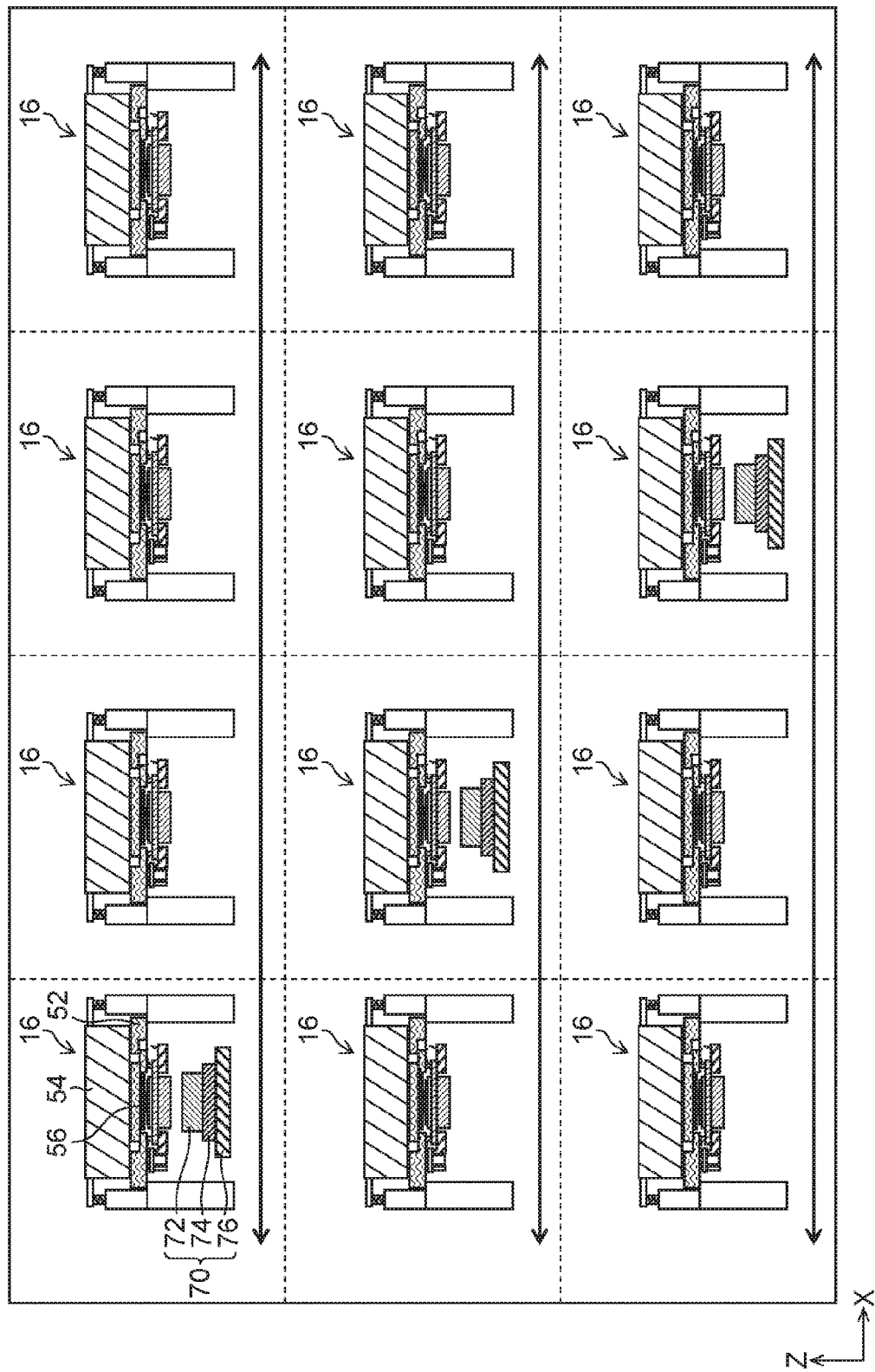
FIG. 3 is a schematic view illustrating a structure of a measuring unit.

FIG. 3 illustrates a structure of the measuring unit 12.

As illustrated in FIG. 3, the measuring unit 12 has a layered structure (multistage structure) in which the plurality of measuring sections 16 are stacked in multiple stages, and each of the measuring sections 16 is disposed along the X and Z directions to form a two-dimensional array. In the present embodiment, four measuring sections 16 arranged in the X direction are stacked in each of three stages in the Z direction, for example. Each of the measuring sections 16 has the same structure, and includes a wafer chuck 50, a probe card 56, and the like, as described below in detail.

The measuring unit 12 includes a case (casing) (not illustrated) having a lattice shape in which a plurality of frames are assembled in a lattice pattern. This case (casing) is formed by assembling a plurality of frames extending in each of the X direction, the Y direction, and the Z direction in a lattice pattern, and components of the measuring sections 16 are respectively disposed in spaces surrounded by the frames.

Figure 4:
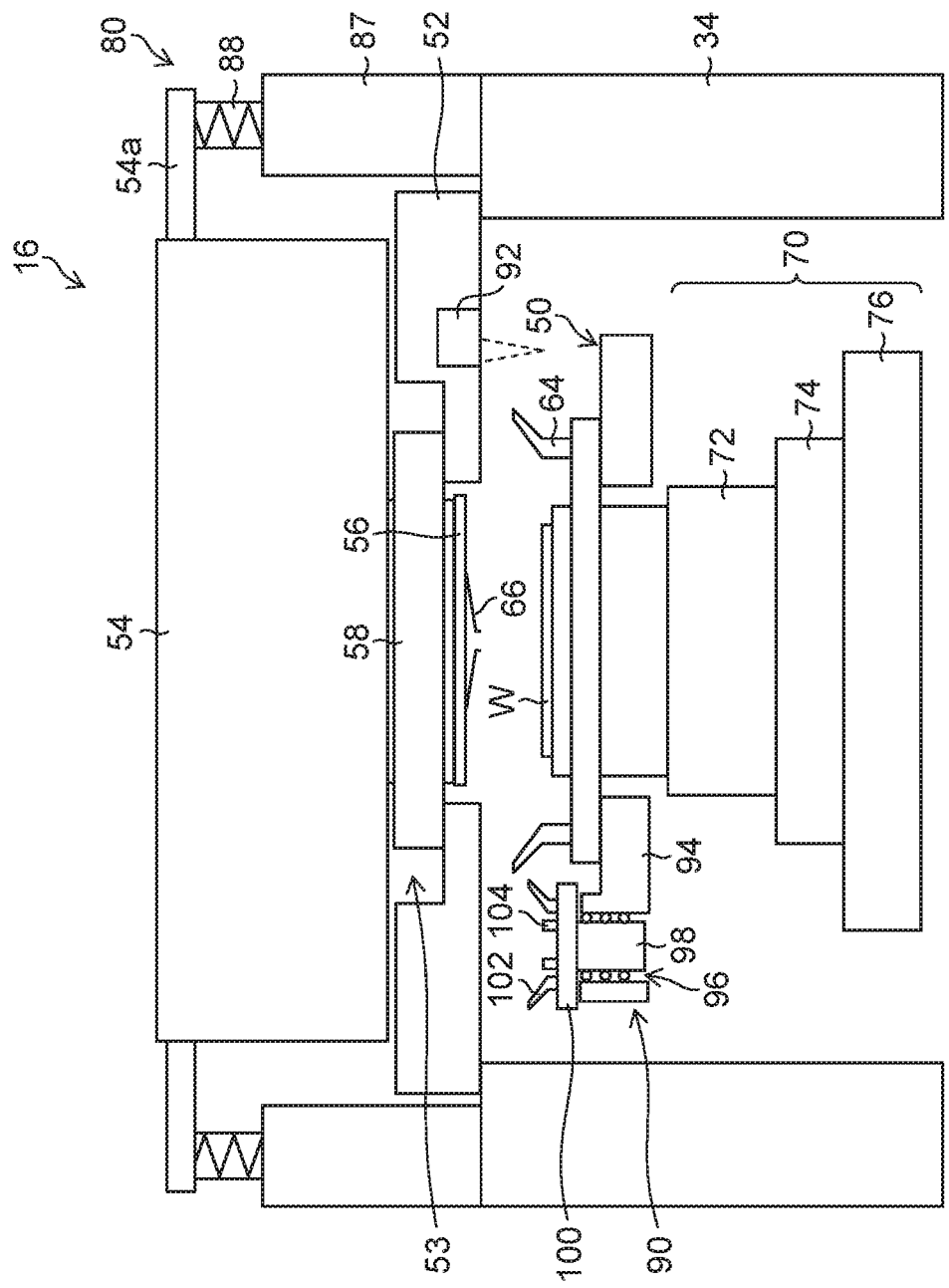
FIG. 4 is a schematic view illustrating a structure of a measuring section.

Subsequently, a structure of the measuring section 16 will be described. FIG. 4 is a schematic view illustrating a structure of the measuring section 16.

As illustrated in FIG. 4, the measuring section 16 includes the wafer chuck 50, a head stage 52, a test head 54, the probe card 56, and a pogo frame 58.

The test head 54 is supported above the head stage 52 by a test head holding part 80 that is described below in detail. The test head 54 is electrically connected to probes 66 of the probe card 56. The test head 54 supplies power and a test signal to each of chips for an electrical inspection, and detects an output signal from each of the chips to determine whether each of the chips operates correctly.

The head stage 52 is supported by a frame member 34 constituting a part of the case body (casing), and includes a pogo frame attachment portion 53 having a circular opening corresponding to a planar shape of the pogo frame 58. The pogo frame attachment portion 53 includes a positioning pin (not illustrated), and the pogo frame 58 is fixed to the pogo frame attachment portion 53 while being positioned by the positioning pin. In the present embodiment, for example, the pogo frame attachment portion 53 includes a suction face to which the pogo frame 58 is sucked and fixed, and suction unit (suction means) (not illustrated) sucks the pogo frame 58 to fix the pogo frame 58 to the suction face of the pogo frame attachment portion 53. Thereby the pogo frame 58 can be reliably fixed to the head stage 52. A fixing method of the pogo frame 58 is not limited to that of the present embodiment, and mechanical fixing means, such as a screw, may be used, for example.

The pogo frame 58 includes a large number of pogo pins (not illustrated) each electrically connect one of terminals formed in the bottom surface (a surface facing the pogo frame 58) of the test head 54 to the corresponding one of terminals formed in the top surface (a surface facing the pogo frame 58) of the probe card 56. In addition, a ring-shaped seal member (not illustrated) is formed in each of outer peripheral portions of the top surface (a surface facing the test head 54) and the bottom surface (a surface facing the probe card 56) of the pogo frame 58. Then, the suction means (not illustrated) reduces pressure in a space surrounded by the test head 54, the pogo frame 58, and the seal member on the top surface side, and in a space surrounded by the probe card 56, the pogo frame 58, and the seal member on the bottom surface side, so that the test head 54, the pogo frame 58, and the probe card 56 are integrated. The top surface and bottom surface of the pogo frame 58 are examples of, respectively, the first suction fixing part and the second suction fixing part.

The probe card 56 includes a plurality of probes 66, such as cantilevers and spring pins, each of which is disposed corresponding to an electrode of the corresponding one of chips of a wafer W to be inspected. Each of the probes 66 is formed to project downward from the bottom surface (a surface facing the wafer chuck 50) of the probe card 56, and is electrically connected to the corresponding one of terminals provided in the top surface (a surface facing the pogo frame 58) of the probe card 56. Thus, when the test head 54, the pogo frame 58, and the probe card 56 are integrated, each of the probes 66 is electrically connected to the corresponding one of the terminals of the test head 54 through the pogo frame 58. The probe card 56 of the present example includes a large number of probes 66 each corresponding to an electrode of the corresponding one of all chips of a wafer W to be inspected, and each of the measuring sections 16 simultaneously inspects all chips of the wafer W held by the wafer chuck 50.

The wafer chuck 50 sucks and fixes the wafer W using vacuum suction or the like. The wafer chuck 50 is supported and fixed by an alignment device 70 described below in a detachable manner. The alignment device 70 performs relative positioning between the wafer W held by the wafer chuck 50 and the probe card 56 by moving the wafer chuck 50 in the X, Y, Z, and θ directions.

In an outer peripheral portion of the top surface (wafer loading surface) of the wafer chuck 50, a ring-shaped seal member 64 (hereinafter referred to as a "chuck seal rubber") with elasticity is provided. When a Z-axis movement-rotation unit 72 described below moves (raises) the wafer chuck 50 toward the probe card 56, the chuck seal rubber 64 is brought into contact with the bottom surface of the head stage 52 to form an internal space S (refer to FIG. 5) surrounded by the wafer chuck 50, the probe card 56 (head stage 52), and the chuck seal rubber 64. Then, the suction means (pressure reducing unit that is not illustrated) reduces pressure in the internal space S described above, so that the wafer chuck 50 is drawn toward the probe card 56. Thereby, each of the probes 66 of the probe card 56 is brought into contact with an electrode pad of the corresponding one of chips of the wafer W, and inspection is ready to be started. The chuck seal rubber 64 is an example of an annular seal member.

Inside the wafer chuck 50, a heating/cooling mechanism (not illustrated) as a heating/cooling source is provided so that a chip can be inspected for its electrical characteristics at a high temperature (e.g., 150° C. at the maximum), or at a low temperature (e.g., −40° C. at the minimum). A publicly known appropriate heater/cooler can be used as the heating/cooling mechanism. For example, there are thought various devices, such as: a device with a double layer structure including a heating layer of a flat heater, and a cooling layer provided with a passage of a cooling fluid; and a heating/cooling device with one layer structure in which a cooling pipe wound by a heater is buried in a thermal conductor. In addition, a device in which a thermal fluid is circulated instead of using electrical heating may be used, and also s Peltier element may be used.

The alignment device 70 supports the wafer chuck 50 in a detachable manner using vacuum suction or the like. As described above, the alignment device 70 is configured to perform relative positioning between the wafer W held by the wafer chuck 50 and the probe card 56. The alignment device 70 includes: the Z-axis movement-rotation unit 72 that supports and fixes the wafer chuck 50 in a detachable manner, and moves the wafer chuck 50 in a Z-axis direction and rotates the wafer chuck 50 in the θ direction around a Z-axis; an X-axis movable base 74 that supports the Z-axis movement-rotation unit 72 and moves in an X-axis direction; and a Y-axis movable base 76 that supports the X-axis movable base 74 and moves in a Y-axis direction.

Each of the Z-axis movement-rotation unit 72, the X-axis movable base 74, and the Y-axis movable base 76 is configured to allow the wafer chuck 50 to be movable or rotatable in a predetermined direction by using a mechanical driving mechanism including at least a motor. The mechanical driving mechanism is configured by a ball screw driving mechanism in which a servo motor and a ball screw are combined with each other, for example. The mechanical driving mechanism is not limited to the ball screw driving mechanism, and may be configured by a linear motor driving mechanism, a belt driving mechanism, or the like. The Z-axis movement-rotation unit 72 is an example of a mechanical lifting unit.

The alignment device 70 is provided for each of stages (refer to FIG. 3), and is configured to be mutually movable among a plurality of measuring sections 16 disposed in the respective stages by using an alignment device driving mechanism (not illustrated). That is, the alignment device 70 is shared by the plurality of measuring sections 16 (four measuring sections 16 in the present example) disposed in the same stage, and is mutually moved among the plurality of measuring sections 16 disposed in the same stage. The alignment device 70 moved to each of the measuring sections 16 is fixed while being positioned at a predetermined position by a positioning/fixing device (not illustrated), and then the alignment device driving mechanism described above performs relative positioning between the wafer W held by the wafer chuck 50 and the probe card 56 by moving the wafer chuck 50 in the X, Y, Z, and θ directions. Although illustration is omitted, the alignment device 70 includes a probe position detecting camera and a wafer alignment camera to detect a relative positional relationship between the probe 66 and the electrode of each of chips of the wafer W held by the wafer chuck 50.

In the present embodiment, although the alignment device 70 (Z-axis movement-rotation unit 72) is provided in its top surface with a suction port (an example of a wafer chuck fixing part), and sucks and fixes the wafer chuck 50 by using the suction means (not illustrated), various well-known methods can be used as a fixing method of the wafer chuck 50 as far as the wafer chuck 50 can be fixed in a detachable manner. For example, a mechanical method such as clamping may be used. In addition, it is preferable that the alignment device 70 includes a positioning member (not illustrated) so that a relative positional relationship with the wafer chuck 50 is always constant.

In addition to the structure described above, the present embodiment includes a plurality of chuck guide mechanisms 90 that guide the wafer chuck 50 in the Z direction (vertical direction), as a structure to prevent the wafer chuck 50 from being displaced and inclined in the X and Y directions (horizontal directions) when the wafer chuck 50 is drawn toward the probe card 56 by reducing pressure in the internal space S. The chuck guide mechanisms 90 are an example of a guide unit.

The plurality of chuck guide mechanisms 90 are provided in a peripheral portion of the wafer chuck 50, particularly in an outer peripheral portion of a chuck guide holding portion 94 which is integrated with the wafer chuck 50, in parallel along a circumferential direction. The chuck guide mechanisms 90 serve as a guide mechanism that moves the wafer chuck 50 parallel to the Z direction while restricting movement of the wafer chuck 50 in the horizontal directions by fixing a chuck guide 98 described below to the head stage 52 by sucking the chuck guide 98 using vacuum suction or the like before operation to draw the wafer chuck 50 toward the probe card 56 is performed by reducing pressure in the internal space S. Thus, in the wafer chuck 50 (chuck guide holding portion 94), at least three chuck guide mechanisms 90 are provided at respective positions different from each other in the horizontal directions (X and Y directions) which are orthogonal to a movement direction (Z direction) of the wafer chuck 50. While illustrating is eliminated in the present example, three chuck guide mechanisms 90 are provided in the chuck guide holding portion 94 along the circumferential direction at equal intervals (equal distance) (for each 120-degree). Figure illustrates only the one chuck guide mechanism 90.

Structure of the chuck guide mechanism 90 will be described in detail below.

The chuck guide mechanism 90 includes a bearing 96 formed in the chuck guide holding portion 94, and a chuck guide (guide shaft) 98 that is configured to be movable in the Z direction (vertical direction) while movement of the chuck guide in the X and Y directions (horizontal directions) is restricted by the bearing 96. The bearing 96 is composed of a ball bearing, for example.

The chuck guide 98 is rotatably supported by the bearing 96, and is provided in its upper portion with a fixing part 100 that fixes the chuck guide 98 to the head stage 52 in a detachable manner. On the top surface of the fixing part 100, a ring-shaped seal member (hereinafter referred to as a "chuck guide seal rubber") 102 is provided, and on the inner side of the chuck guide seal rubber 102, there are provided a suction port (not illustrated) to be connected to the suction means (not illustrated), and a clearance holding member 104 for maintaining a constant distance (clearance) between the fixing part 100 and the head stage 52. The clearance holding member 104 is not particularly limited in shape as far as it can maintain a constant clearance between the fixing part 100 and the head stage 52.

According to the structure described above, the Z-axis movement-rotation unit 72 moves the wafer chuck 50 up to a predetermined height to bring the chuck guide seal rubber 102 into contact with the head stage 52. Then, the suction means (not illustrated) reduces pressure in an internal space Q formed among the chuck guide seal rubber 102, the head stage 52, and the fixing part 100, so that the fixing part 100 of the chuck guide 98 is sucked and fixed to the head stage 52. At this time, the clearance holding member 104 described above secures a predetermined clearance between the fixing part 100 and the head stage 52 to prevent excess suction by the fixing part 100 of the chuck guide 98, so that the chuck guide 98 fixed to the head stage 52 can be prevented from being inclined. Then, the chuck guide 98 fixed to the head stage 52 allows the wafer chuck 50 to be moved in the Z direction while restricting movement of the wafer chuck 50 in the X and Y directions when the wafer chuck 50 is drawn toward the probe card 56 by reducing pressure in the internal space S. This enables preventing inclination and displacement of the wafer chuck 50 due to an unbalanced load caused by components of the wafer chuck 50, so that delivery operation of the wafer chuck 50 can be stably performed while parallelism is maintained. As a result, excellent contact between the electrode pad on the wafer W and the probe 66 can be achieved.

In the present embodiment, a height detection sensor 92 for detecting a relative distance between the head stage 52 and the wafer chuck 50 is provided in the head stage 52. The height detection sensor 92 is provided to monitor a height position and an inclination of the wafer chuck 50 when the wafer chuck 50 is drawn toward the probe card 56 by reducing pressure in the internal space S. Thus, in the head stage 52, at least three height detection sensors 92 are provided at respective positions different from each other in the X and Y directions (horizontal directions) orthogonal to the Z direction (vertical direction) being a movement direction of the wafer chuck 50 (FIG. 4 illustrates only one height detection sensor 92). According to the structure described above, a height position and an inclination of the wafer chuck 50 can be monitored from a detection result of each of the height detection sensors 92. Thus, when the wafer chuck 50 is drawn toward the probe card 56 by reducing pressure in the internal space S, a crushing amount (overdrive amount) of the probe 66 can be checked, and inclination of the wafer chuck 50, state change during measurement, and the like, can be monitored, so that it is possible to accurately determine whether measurement is correctly performed.

Figure 6:
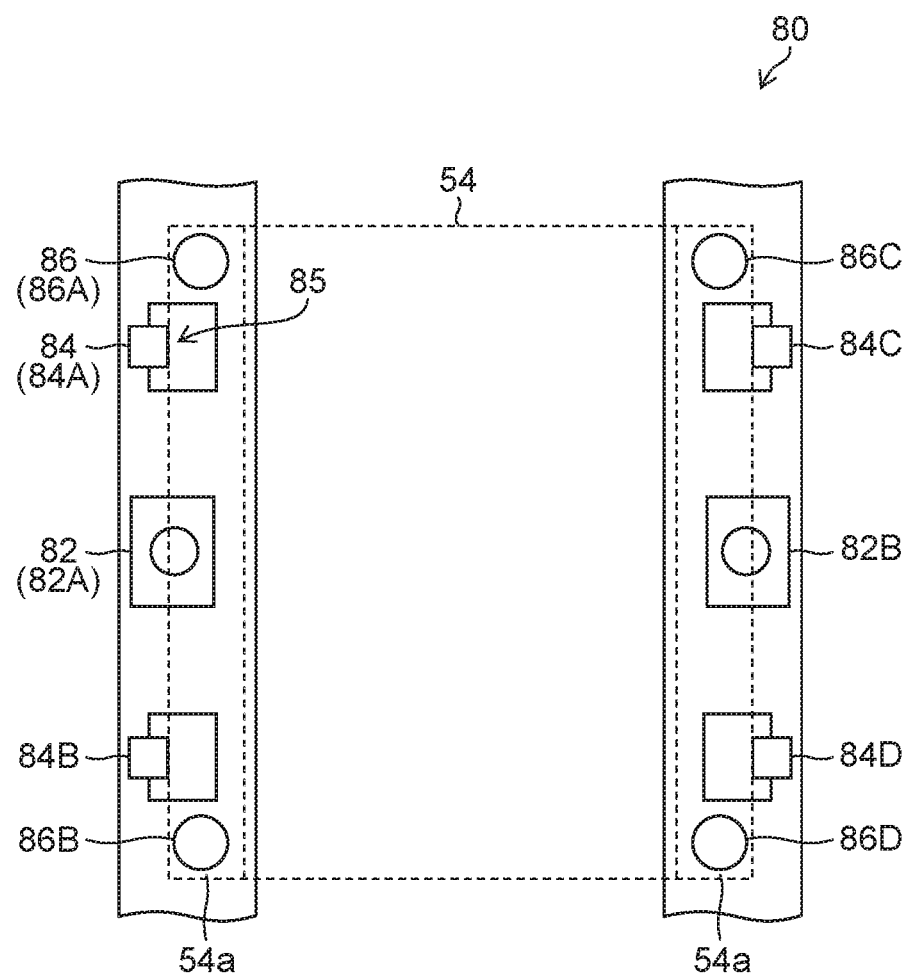
FIG. 6 is a plan view illustrating planar placement in a test head holding part.
Figure 7:
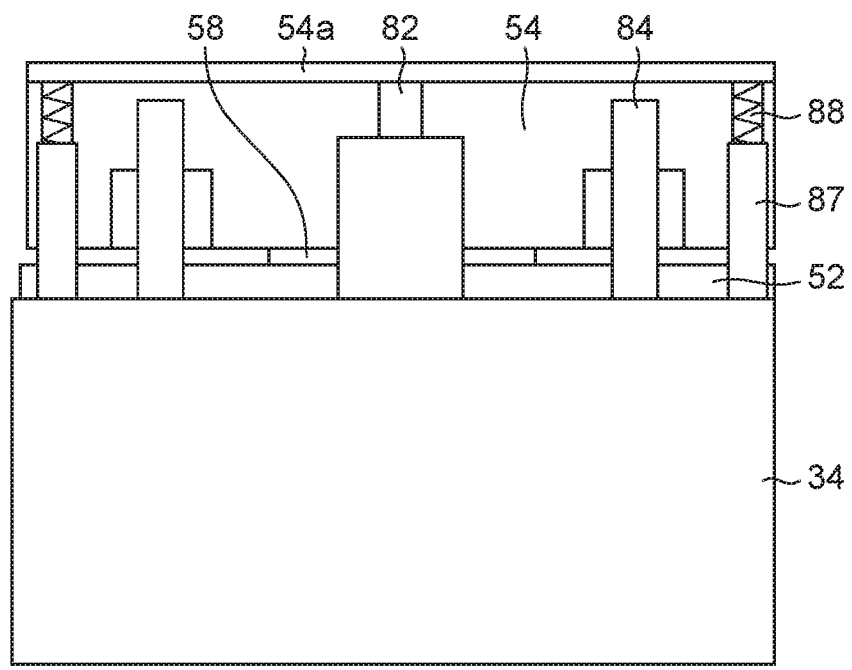
FIG. 7 is a side view of the test head holding part as viewed from the side.

Subsequently, structure of the test head holding part 80 will be described in detail with reference to FIGS. 4 to 7. FIG. 6 is a plan view illustrating planar placement in the test head holding part 80, and FIG. 7 is a side view of the test head holding part 80 as viewed from the side. In FIG. 6, the test head 54 is illustrated by a broken line for convenience of description.

As illustrated in FIGS. 4 to 7, the test head holding part 80 is provided between a receiving part 54*a* provided on a top surface side of the test head 54 and the frame member 34. The test head holding part 80 has a lower end mounted on the frame member 34, and an upper end supporting the receiving part 54*a* of the test head 54. That is, the test head 54 is supported by the frame member 34 through the test head holding part 80, so that a load of the test head 54 is not directly applied to the head stage 52. As a result, parallelism between the probe card 56 and a wafer W can be maintained to enable wafer-level inspection to be performed with high accuracy. Specific structure of the test head holding part 80 is as follows.

The test head holding part 80 includes a lifting mechanism 82 that moves up and down the test head 54 in the Z direction, a guide part 84 that guides movement of the test head 54 in the Z direction when the test head 54 is moved up and down by the lifting mechanism 82, and a buffer 86 that maintains a constant distance (clearance) between the test head 54 and the probe card 56, and parallelism therebetween at a constant level.

The lifting mechanism 82 is composed of an air cylinder, or an electrically-powered assembly, for example, and moves up and down the test head 54 in the Z direction. A lower end of the lifting mechanism 82 is fixed to the frame member 34, and an upper end of the lifting mechanism 82 supports the receiving part 54*a* of the test head 54. The number of the lifting mechanism 82 and the arrangement of the lifting mechanism 82 are not particularly limited as far as the test head 54 can be moved up and down in the Z direction. In the present embodiment, two lifting mechanisms 82A and 82B are provided in the receiving part 54*a* of the test head 54, for example. This allows a load of the test head 54 to be distributed to each of the lifting mechanisms 82A and 82B, so that the test head 54 can be moved up and down in the Z direction in a steady and reliable manner. The receiving part 54*a* of the test head 54 includes a flange face (projecting face) projecting laterally (in the X direction) from the upper end of the test head 54, and the flange face is supported by the upper end of the lifting mechanism 82.

The guide part 84 includes a restriction face 85 facing a side face (a face perpendicular to the X direction) of the test head 54, and guides movement of the test head 54 in the Z direction in a state where the movement of the test head 54 in the horizontal direction (the X and Y directions) is restricted by bringing the side face of the receiving part 54*a* of the test head 54 into contact with the restriction face 85. The number and the arrangement of the guide part 84 are not particularly limited as far as a position and a direction of the test head 54 can be restricted. In the present embodiment, four guide parts 84A to 84D are provided so as to be across side faces of the respective receiving parts 54*a* on opposite sides of the test head 54, for example. Specifically, the guide parts 84A and 84B are disposed on the corresponding sides across the lifting mechanism 82A, and the guide parts 84C and 84D are disposed on the corresponding sides across the lifting mechanism 82B. In other words, the guide part 84A and the guide part 84C, as well as the guide part 84B and the guide part 84D, are respectively disposed at the corresponding positions facing each other across the test head 54. This allows vertical movement of the test head 54 to be guided in a state where movement (a position and a direction) of the test head 54 in the horizontal direction is restricted by each of the guide parts 84 (84A to 84D), when the test head 54 is moved up and down in the vertical direction.

The buffer 86 includes a spring member 88 provided between a spring receiving part 87 fixed to the frame member 34 and the receiving part 54*a* of the test head 54. The spring member 88 has urging force urging upward (or toward an opposite side of the pogo frame 58) the test head 54, and a function of properly maintaining distance and parallelism between the test head 54 and the pogo frame 58. In the present embodiment, a plurality of buffers 86A to 86D are provided, for example, and each of the buffers 86A to 86D supports the corresponding one of edges of the receiving part 54*a* of the test head 54. That is, each of the buffers 86A to 86D is disposed at a position away from (separated from) a barycenter of the test head 54 at an equal interval. This allows a load of the test head 54 to be equally distributed, so that a horizontal posture of the test head 54 can be properly maintained.

According to the structure described above, the test head 54 is guided by the guide parts 84 (84A to 84D) to be moved in the Z direction (vertical direction) by the lifting mechanisms 82(82A and 82B) while its movement in the X and Y directions (horizontal directions) is restricted by the guide parts 84 (84A to 84D). This enables the test head 54 to be moved between a retreat position and a mounting position in a steady manner.

When the test head 54 is moved up to the mounting position by the lifting mechanisms 82 (82A and 82B), distance and parallelism between the test head 54 and the pogo frame 58 can be properly maintained by the spring member 88 of each of the buffers 86 (86A to 86D). Thus, once parallelism between the test head 54 and the pogo frame 58 is adjusted during initial setting, the parallelism is always maintained even if the test head 54 is moved up and down. As a result, the test head 54 does not need to be adjusted for parallelism again, so that time and effort required for the adjustment can be reduced.

Subsequently, an inspection method using the prober 10 of the present embodiment will be described.

In the inspection method using the prober 10 of the present embodiment, an integration step of integrating the test head 54, the pogo frame 58, and the probe card 56 is performed as a preliminary preparation. Specifically, the integration step is performed as follows.

In the integration step, firstly, the pogo frame 58 is sucked and fixed to the head stage 52 by using vacuum suction or the like, and then the probe card 56 is sucked and fixed to the pogo frame 58 by using vacuum suction or the like. Subsequently, the test head 54 is moved up to the mounting position by the lifting mechanism 82 while movement of the test head 54 in the X and Y directions (horizontal directions) is restricted by the guide part 84. At this time, the test head 54 is not in contact with the pogo frame 58, and the spring member 88 of each of the buffers 86 (86A to 86D) properly maintains distance (clearance) and parallelism between the test head 54 and the pogo frame 58. Then, the test head 54 is sucked and fixed to the pogo frame 58 by using vacuum suction or the like. Thereby, the test head 54, the pogo frame 58, and the probe card 56 are integrated.

After the integration step is performed as described above, the following operation is performed in the prober 10.

First in the loader unit 14, a wafer W in the wafer cassette 20 is taken out by the transportation arm 24 of the transportation unit 22, and then is transported to the corresponding one of the measuring sections 16 of the measuring unit 12 in a state where the wafer W is held in the top surface of the transportation arm 24.

Meanwhile, in the measuring unit 12, the alignment device 70 provided for each of stages is moved to a predetermined measuring section 16, and then the wafer chuck 50 is sucked and fixed to the top surface of the alignment device 70 after positioning of the wafer chuck 50 is performed.

Subsequently, the alignment device 70 moves the wafer chuck 50 to a predetermined delivery position. When the wafer W is delivered from the transportation unit 22 of the loader unit 14, the wafer W is held on the top surface of the wafer chuck 50.

Subsequently, the alignment device 70 moves the wafer chuck 50 holding the wafer W to a predetermined alignment position, and then the probe position detecting camera and the wafer alignment camera, which are not illustrated, detect a relative positional relationship between the electrode of each of chips of the wafer W held in the wafer chuck 50 and the probe 66. The wafer chuck 50 is then moved in the X, Y, Z, and θ directions on the basis of the detected positional relationship to perform relative positioning between the wafer W held by the wafer chuck 50 and the probe card 56.

After the positioning is performed, the alignment device 70 moves the wafer chuck 50 to a predetermined measuring position (a position facing the probe card 56), and then the Z-axis movement-rotation unit 72 of the alignment device 70 raises the wafer chuck 50 to a height at which the chuck guide seal rubber 102 is brought into contact with the head stage 52. At this time, as to a height of the wafer chuck 50 after being raised (a top surface height of the wafer chuck 50), it is preferable that the height position of the wafer chuck 50 after being raised is higher than a height position of the tip position (contact position) of the probe 66. In this case, each of the probes 66 of the probe card 56 is brought into contact with the electrode pad of the corresponding one of chips of the wafer W in a state where each of the probes 66 is overdriven. Therefore, the tip of each of the probes 66 digs into a surface of the electrode pad to form a probe trace in the surface of the electrode pad. An oxide film formed on the electrode pad can be removed by contact of the probe 66, and displacement (lateral displacement) of the probe 66 in the X and Y directions (horizontal directions) can be prevented against a disturbance (vibration) caused when the wafer chuck 50 is delivered from the alignment device 70 to the head stage 52 (probe card 56 side). Here, if influence of an oxide film formed on the electrode pad is small, the height position of the wafer chuck 50 after being raised may be at a position (clearance height) lower than the height position of the tip position (contact position) of the probe 66.

Subsequently, the chuck guide 98 of the chuck guide mechanism 90 is fixed to the head stage 52. Specifically, after the chuck guide seal rubber 102 is brought into contact with the head stage 52 as described above, the fixing part 100 is sucked and fixed to the head stage 52 by reducing pressure in the internal space Q formed on an inner side of the chuck guide seal rubber 102, the head stage 52, and the fixing part 100 by using the suction means (pressure reducing unit), which is not illustrated.

Subsequently, after Z-axis movement-rotation unit 72 releases the sucking and fixing of the wafer chuck 50, the suction means (not illustrated) reduces pressure in the internal space S surrounded by the head stage 52 (probe card 56), the wafer chuck 50, and the chuck seal rubber 64, while a height position of the wafer chuck 50 is detected by the plurality of height detection sensors 92 provided in the head stage 52. At this time, because the chuck guide 98 (fixing part 100) of the chuck guide mechanism 90 is sucked and fixed to the head stage 52 as described above, movement of the wafer chuck 50 in the Z direction (vertical direction) is guided by the chuck guide 98 while movement the wafer chuck 50 in the X and Y directions (horizontal directions) is restricted by the chuck guide 98. Thereby, the wafer chuck 50 is drawn toward the probe card 56 without being inclined and displaced, and the probe card 56 and the wafer chuck 50 are brought into close contact with each other to allow each of the probes 66 of the probe card 56 to be in contact with the electrode pad of the corresponding one of chips of the wafer W with a uniform contact pressure.

In the present embodiment, the height position and the inclination of the wafer chuck 50 is acquired on the basis of a detection result of each of the height detection sensors 92, and a process of determining whether a value of each of the height position and the inclination is within a proper range is to be performed. This determination process is performed by the control device described above. Accordingly, it is possible to check a crushing amount (overdrive amount) of a probe 66, to monitor the inclination of the wafer chuck 50, state change during measurement, and the like, and to accurately determine whether measurement is correctly performed, when the wafer chuck 50 is drawn toward the probe card 56 by reducing pressure in the internal space S.

Figure 5:
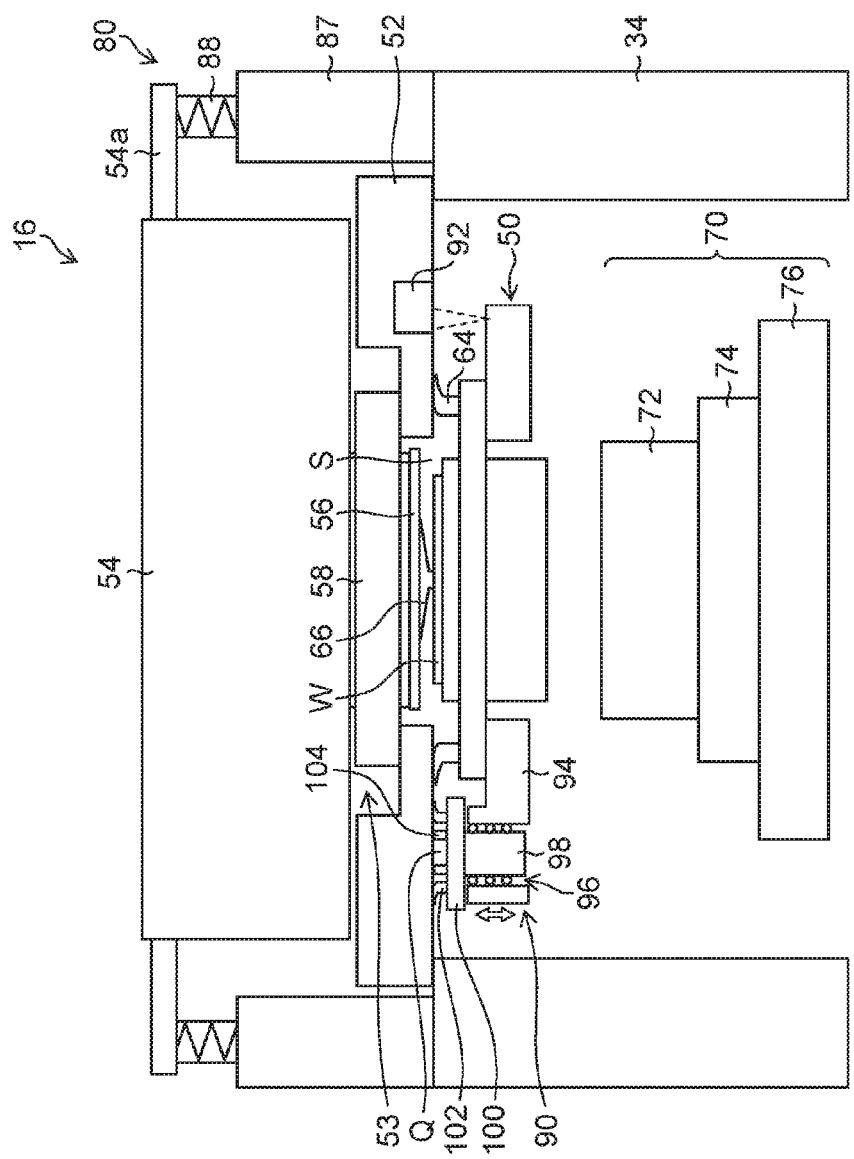
FIG. 5 illustrates a state after a wafer chuck is delivered to a head stage side.

When the wafer chuck 50 is delivered from the alignment device 70 (Z-axis movement-rotation unit 72) to the head stage 52 (probe card 56 side) as described above, the test head 54, the pogo frame 58, the probe card 56, and the wafer chuck 50 are integrated as illustrated in FIG. 5, and each of the probes 66 of the probe card 56 is in contact with the electrode pad of the corresponding one of chips of the wafer W with a uniform contact pressure. Accordingly, wafer-level inspection is ready to be started. After that, the test head 54 supplies power and a test signal to each of the chips of the wafer W though the corresponding one of the probes 66, and a signal output from each of the chips is detected to perform an electrical performance test.

Here, after the wafer chuck 50 is delivered from the alignment device 70 (Z-axis movement-rotation unit 72) to the head stage 52 (probe card 56 side), the alignment device 70 is moved to another measuring section 16 to perform contact operation in the other measuring section 16 through the same procedure, whereby the wafer-level inspection is sequentially performed.

As described above, according to the present embodiment, the test head 54 is configured to be supported by the frame member 34 by providing the test head holding part 80 between the receiving part 54a of the test head 54 and the frame member 34. Thus, a load of the test head 54 is not directly applied to the head stage 52, so that deformation of the pogo frame 58 is prevented. As a result, parallelism between the wafer W and the probe card 56 can be easily secured to enable improvement in accuracy of wafer-level inspection.

Particularly according to the present embodiment, because the test head holding part 80 includes the lifting mechanism 82 and the guide part 84, the test head 54 can be movable between a retreat position and a mounting position in a steady manner while being guided by the guide part 84 in a state where movement (position and direction) of the test head 54 in the horizontal directions is restricted. This improves maintenance workability of the test head 54.

Further, because the test head holding part 80 includes the buffer 86 having the spring member 88, the distance and parallelism between the test head 54 and the pogo frame 58 can be properly maintained. This enables the test head 54 to be moved between the mounting position and the retreat position in a steady manner.

In the present embodiment, the pogo frame 58 is fixed to the head stage 52 by suction, further, the test head 54, the pogo frame 58, and the probe card 56 are fixed by suction. Accordingly, it is possible to secure contact pressure required to achieve electrical continuity between the test head 54 and the pogo frame 58, and between the probe card 56 and the pogo frame 58, respectively. This can suppress influence of variation of terminals connecting between them.

In addition, in the present embodiment, wafer-level inspection is performed in a state where the test head 54, the pogo frame 58, the probe card 56, and the wafer chuck 50 are integrated with respect to (relative to) the head stage 52. Thus, it is possible to facilitate contact operation of bringing each of the probes 66 into contact with the electrode pad of the corresponding one of chips of the wafer W while parallelism between the wafer W and the probe card 56 is maintained. That is, each probe 66 can be brought into contact with the electrode pad of each chip of the wafer W with a proper contact pressure and accuracy of the wafer-level inspection can be improved.

In addition, the present embodiment includes the chuck guide mechanism 90 that guides the wafer chuck 50 in the Z direction along the chuck guide 98 in a state where the chuck guide 98 (fixing part 100) of the chuck guide mechanism 90 is sucked and fixed to the head stage 52 by using vacuum suction or the like. This enables the wafer chuck 50 to be prevented from being inclined and displaced when the wafer chuck 50 is drawn toward the probe card 56 by reducing pressure in the internal space S. Thus, it is possible to prevent inclination and displacement of the wafer chuck 50 due to an unbalanced load caused by components of the wafer chuck 50, and to perform delivery operation of the wafer chuck 50 in a steady manner while parallelism is maintained. As a result, excellent contact between each electrode pad on the wafer W and each probe 66 can be achieved.

Further, because the head stage 52 includes at least three height detection sensors 92 each of which detects a relative distance between the wafer chuck 50 and the head stage 52 in the present embodiment, a height position and an inclination of the wafer chuck 50 can be monitored on the basis of a detection result of each of the height detection sensors 92. Accordingly, it is possible to check a crushing amount (overdrive amount) of a probe 66, to monitor the inclination of the wafer chuck 50, state change during measurement and the like, and to accurately determine whether measurement is correctly performed, when the wafer chuck 50 is drawn toward the probe card 56 by reducing pressure in the internal space S.

Here, although a suction method such as vacuum suction, is shown as a fixing method of the chuck guide mechanism 90 in the embodiment described above, various well-known methods can be used as far as the chuck guide 98 can be fixed to the head stage 52 in a detachable manner. For example, a mechanical method such as clamping may be used.

Further, in the embodiment described above, although there is shown the structure in which the chuck guide mechanism 90 is provided on a wafer chuck 50 side to allow the chuck guide 98 (fixing part 100) to be sucked toward the head stage 52, the chuck guide mechanism 90 may be provided on a head stage 52 side to allow the chuck guide 98 (fixing part 100) to be sucked toward the wafer chuck 50.

In addition, in the embodiment described above, although there is shown the structure in which the height detection sensors 92 are provided in the head stage 52, any structure may be employed as long as it is possible to detect a relative distance between the wafer chuck 50 and the head stage 52. For example, the height detection sensors 92 may be provided in the wafer chuck 50.

As described above, while the prober of the present invention is described in detail, the present invention is not limited to the examples above, and may include various modifications and variations within a range without departing from the essence of the present invention as a matter of course.

REFERENCE SIGNS LIST

10 . . . prober, 12 . . . measuring unit, 14 . . . loader unit, 16 . . . measuring unit, 18 . . . load port, 20 . . . wafer cassette, 21 . . . operation panel, 22 . . . transportation unit, 24 . . . transportation arm, 30 . . . case, 32A, 32B, 32C . . . separated case, 50 . . . wafer chuck, 52 . . . head stage, 54 . . . test head, 56 . . . probe card, 58 . . . pogo frame, 64 . . . chuck seal rubber, 66 . . . probe, 70 . . . alignment device, 72 . . . Z-axis movement-rotation unit, 74 . . . X-axis movable base, 76 . . . Y-axis movable base, 80 . . . test head holding part, 82 . . . lifting mechanism, 84 . . . guide part, 85 . . . restriction face, 86 . . . buffer, 88 . . . spring member, 90 . . . chuck guide mechanism, 92 . . . height detection sensor, 94 . . . chuck guide holding portion, 96 . . . bearing, 98 . . . chuck guide, 100 . . . fixing part, 102 . . . chuck guide seal rubber, 104 . . . clearance holding member.

What is claimed is:

1. A prober comprising:
   a housing including a plurality of frame members;
   a test head configured to inspect electrical characteristics of a wafer;
   a wafer chuck configured to hold the wafer;
   a probe card having probes on a surface facing the wafer chuck;
   a pogo frame provided between the probe card and the test head, and configured to electrically connect the probe card and the test head;
   a seal member configured to form a sealed space between the wafer chuck and the probe card;
   a pressure reducing unit configured to reduce pressure in the sealed space to allow the wafer chuck to be drawn toward the probe card;
   a head stage including a pogo frame attachment portion to which the pogo frame is attached;

a vertical frame member, which is one of the plurality of frame members, the vertical frame member being vertically erected, having a top end and a bottom end, and configured to support the head stage in a first support position directly over the top end of the vertically erected frame member; and a test head holding part supported by the vertical frame member in a second support position directly over the top end of the vertical frame member, the second support position being different from the first support position, and the test head holding part being configured to hold the test head, the test head holding part including a buffer configured to elastically support the test head.

2. The prober according to claim 1, wherein the buffer includes an elastic member configured to urge the test head toward a side opposite to the pogo frame.

3. The prober according to claim 1, wherein the test head holing part includes a plurality of buffers configured to elastically support the test head at positions different from each other, respectively.

4. The prober according to claim 3, wherein the plurality of buffers are provided at positions away from the barycenter of the test head at an equal distance.

5. The prober according to claim 1, wherein the test head holding part includes:
a lifting mechanism configured to move the test head up and down; and
a guide part having a restriction face configured to guide the test head when the test head is moved up and down.

6. A prober comprising:
a housing including a plurality of frame members;
a test head configured to inspect electrical characteristics of a wafer;
a wafer chuck configured to hold the wafer;
a probe card having probes on a surface facing the wafer chuck;
a pogo frame provided between the probe card and the test head, and configured to electrically connect the probe card and the test head;
a seal member configured to form a sealed space between the wafer chuck and the probe card;
a pressure reducing unit configured to reduce pressure in the sealed space to allow the wafer chuck to be drawn toward the probe card;
a head stage including a pogo frame attachment portion to which the pogo frame is attached;
a test head holding part configured to hold the test head, the test head holding part including a buffer configured to elastically support the test head; and
a vertical frame member, which is one of the plurality of frame members, the vertical frame member being vertically erected, having a top end and a bottom end, and having a first support position configured to support the head stage directly over the top end of the vertically erected frame member, and a second support position different from the first support position and configured to support the test head directly over the top end of the vertically erected frame member via the test head holding part.

7. The prober according to claim 1, wherein:
the buffer includes:
an elastic body configured to urge the test head toward an opposite side of the pogo frame; and
a receiver fixed to the frame member and configured to support the elastic member, wherein:
the receiver and an expansion-contraction direction of the elastic body are arranged on one straight line; and
the receiver is arranged on a side of the head stage, supporting a load of the test head.

8. A prober comprising:
a test head configured to inspect electrical characteristics of a wafer;
a wafer chuck configured to hold the wafer;
a probe card having probes on a surface facing the wafer chuck;
a pogo frame provided between the probe card and the test head, and configured to electrically connect the probe card and the test head;
a seal member configured to form a sealed space between the wafer chuck and the probe card;
a pressure reducing unit configured to reduce pressure in the sealed space to allow the wafer chuck to be drawn toward the probe card;
a head stage including a pogo frame attachment portion to which the pogo frame is attached;
a frame member configured to support the head stage in a first support position; and
a test head holding part supported by the frame member in a second support position different from the first support position and configured to hold the test head, the test head holding part including a buffer configured to elastically support the test head, wherein
the buffer includes:
an elastic body configured to urge the test head toward an opposite side of the pogo frame; and
a receiver fixed to the frame member and configured to support the elastic body, wherein:
the receiver and an expansion-contraction direction of the elastic body are arranged on one straight line, and
the receiver is arranged on a side supporting a load of the test head.

9. The prober according to claim 8, wherein:
a thickness of a top end of the frame member is larger than a thickness of a bottom end of the receiver, and
the bottom end of the receiver is in a position directly over the top end of the frame member.

* * * * *